United States Patent
Kong et al.

(10) Patent No.: US 12,328,816 B2
(45) Date of Patent: Jun. 10, 2025

(54) ASYMMETRICAL LAMINATED CIRCUIT BOARDS FOR IMPROVED ELECTRICAL PERFORMANCE

(71) Applicant: Intel Corporation, Santa Clara, CA (US)

(72) Inventors: Jackson Chung Peng Kong, Pulau Pinang (MY); Bok Eng Cheah, Pulau Pinang (MY); Tin Poay Chuah, Pulau Pinang (MY); Jenny Shio Yin Ong, Pulau Pinang (MY); Seok Ling Lim, Kulim Kedah (MY)

(73) Assignee: Intel Corporation, Santa Clara, CA (US)

( * ) Notice: Subject to any disclaimer, the term of this patent is extended or adjusted under 35 U.S.C. 154(b) by 778 days.

(21) Appl. No.: 17/411,064

(22) Filed: Aug. 25, 2021

(65) Prior Publication Data

US 2021/0385948 A1 Dec. 9, 2021

(51) Int. Cl.
*H05K 1/11* (2006.01)

(52) U.S. Cl.
CPC ............. *H05K 1/113* (2013.01); *H05K 1/115* (2013.01); *H05K 2201/0195* (2013.01); *H05K 2201/10159* (2013.01); *H05K 2201/10212* (2013.01)

(58) Field of Classification Search
None
See application file for complete search history.

(56) References Cited

U.S. PATENT DOCUMENTS

2001/0002727 A1* 6/2001 Shiraishi ............. H01L 23/5385
257/773
2014/0102768 A1* 4/2014 Shizuno ............... H05K 1/0298
174/251

FOREIGN PATENT DOCUMENTS

JP H07283335 A * 10/1995
KR 20170089524 A * 8/2017

OTHER PUBLICATIONS

JP H07283335 A Translation (Year: 2024).*

* cited by examiner

*Primary Examiner* — Hoa C Nguyen
*Assistant Examiner* — John B Freal
(74) *Attorney, Agent, or Firm* — Viering, Jentschura & Partner mbB

(57) ABSTRACT

The present disclosure relates to a printed circuit board assembly including a first circuit board including a first footprint, the first circuit board further includes a plurality of first vertical vias extending between a first side and an opposing second side; a second circuit board including a second footprint smaller than the first footprint, the second circuit board further includes a plurality of second vertical vias extending between a subsequent first side and an opposing subsequent second side; an adhesive layer coupling the first side to the subsequent first side; and a plurality of third vertical vias extending through the first side and the subsequent first side.

16 Claims, 9 Drawing Sheets

ASYMMETRICAL LAMINATED CIRCUIT BOARDS FOR IMPROVED ELECTRICAL PERFORMANCE

BACKGROUND

In a Type-3 printed circuit board (PCB) and its associated plated-through-hole (PTH) structure, signal propagating from a system-on-chip (SOC) to a memory device, or vice versa, transitions via inner PCB layers albeit with PTH stub. This stub is open-ended and therefore, signals reaching this end generate multi-reflection noises which significantly degrade the electrical performance. It is primarily due to this signal integrity impairment that high-speed signals, e.g., LP/DDR5, Thunderbolt Gen4 (TBT4), Universal Serial Bus Gen 4 (USB4) or Peripheral Component Interface Express Gen 5 (PCIe5), are competing for real estate in the bottom half of the PCB layers for routing. Routing at top half of the PCB layers means longer stub are required and thus, larger reflection noises are generated.

Current solution to address this issue is to utilize the more expensive Type-4 PCB, which is a High Density Interconnect (HDI) circuit board, replacing PTH with micro-via structure. This allows inner layer routing transition without the open-ended stub concern. However, this leads to a higher bill of materials (BOM) cost for major original equipment manufacturers (OEMs).

Another alternative is to cope with a Type-3 PCB, albeit with degraded system memory performance, such as from maximum possible LPDDR5 data rate of 6400 MT/s to a couple of speed bins down to 5600 MT/s. However, sticking to lower cost Type-3 PCBs would mean inferior system memory performance (6400 MT/s dropping to 5600 MT/s) and thus, mediocre user experience.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1A:
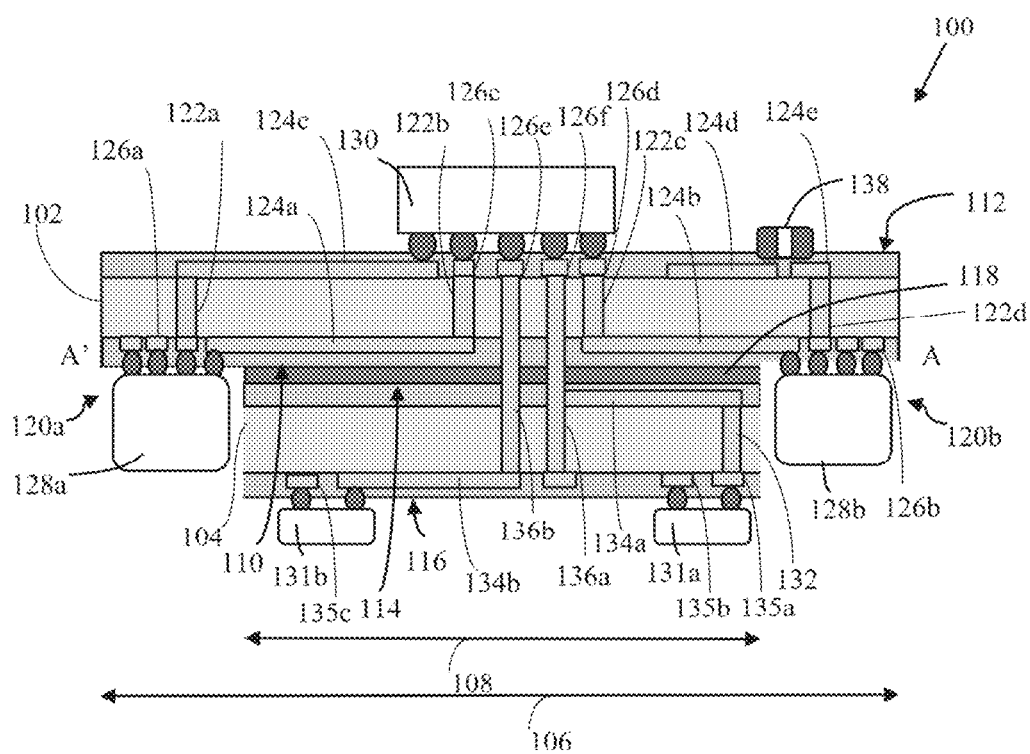
FIG. 1A shows a cross-sectional view of a printed circuit board assembly according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects may be combined with one or more other aspects to form new aspects.

The present disclosure addresses the high-speed signal integrity issue associated with a Type-3 PCB and its associated PTH structure. Briefly, asymmetrical laminated printed circuit boards of different footprints and/or material properties with recessed portion(s) at the board perimeter may be provided. A plurality of electronic components e.g., one or more memory devices and/or connector receptacles mounted within the recessed portion at the opposite of a second device (e.g., central processing unit (CPU), a graphic processing unit (GPU), a chipset, a field programmable gate array (FPGA), etc.) may be provided.

The technical advantages of this disclosure may include but not limited to:

Improved signal integrity performance. This may be achieved in two ways: First, the removal of open-ended PTH stub may minimize reflection noises significantly. Second, signal latency which may be directly proportionate to the interconnect length may be shortened. Instead of 2 PTH transitions for communication between SOC and memory device in a conventional Type-3 PCB, only 1 PTH transition may be needed for more effective signal propagation.

Platform miniaturization may be achieved without a need for high-speed signal traces to compete for bottom PCB layers routing. Without PTH stub concern, signals may also be routed in the top PCB layers thus easing the routing congestion. The additional recess layer may also allow for more components (apart from dynamic random-access memory (DRAM)) to be placed, such as connectors, radio-frequency integrated circuits (RFIC), and passives.

Platform z-height reduction through the DRAM devices placement in the recess or cavity layer. Other "tall" components such as voltage regulator (VRs), discrete graphics (DGs), connectors may also be placed here, thereby minimizing the overall system z-height.

The present disclosure generally relates to a printed circuit board assembly that may include a first circuit board including a first footprint, the first circuit board may further include a plurality of first vertical vias extending between a first side and an opposing second side; a second circuit board including a second footprint smaller than the first footprint, the second circuit board may further include a plurality of second vertical vias extending between a subsequent first side and an opposing subsequent second side; an adhesive layer coupling the first side to the subsequent first side; and a plurality of third vertical vias extending through the first side and the subsequent first side.

In various aspects, the second footprint may form one or more recessed portions at a perimeter of the first footprint.

In various aspects, the printed circuit board assembly may further include one or more first devices coupled to the first side within the one or more recessed portions.

In various aspects, the printed circuit board assembly may further include a second device coupled to the second side, wherein the second device may be coupled to the one or more first devices through the plurality of first vertical vias, a plurality of metal traces and a plurality of contact pads.

In various aspects, the printed circuit board assembly may further include one or more passive components disposed on the second side, wherein the one or more passive components may be coupled to the one or more first devices through the plurality of first vertical vias.

In various aspects, the second circuit board may further include an extended portion having a third footprint extending beyond the perimeter of the first footprint.

In various aspects, the extended portion may further include one or more recesses configured to accommodate the one or more first devices.

In various aspects, the second circuit board may further include a metal shield extending over the one or more recesses and the one or more first devices.

In various aspects, the printed circuit board assembly may further include a first extended device coupled to the extended portion on the subsequent first side.

In various aspects, the first circuit board may further include a first dielectric material with a first dielectric loss tangent and the second circuit board may further include a second dielectric material with a second dielectric loss tangent greater than the first dielectric loss tangent.

The present disclosure also generally relates to a computing device. The computing device may include a communication chip and a printed circuit board assembly coupled to the communication chip. The printed circuit board assembly may include a first circuit board including a first footprint, the first circuit board may further include a plurality of first vertical vias extending between a first side and an opposing second side; a second circuit board including a second footprint smaller than the first footprint, the second circuit board may further include a plurality of second vertical vias extending between a subsequent first side and an opposing subsequent second side; an adhesive layer coupling the first side to the subsequent first side; and a plurality of third vertical vias extending through the first side and the subsequent first side.

The present disclosure further generally relates to a method, e.g., a method including providing a first circuit board including a first footprint, the first circuit board may further include a plurality of first vertical vias extending between a first side and an opposing second side; providing a second circuit board including a second footprint smaller than the first footprint, the second circuit board may further include a plurality of second vertical vias extending between a subsequent first side and an opposing subsequent second side; coupling the first side to the subsequent first side by an adhesive layer; and extending a plurality of third vertical vias through the first side and the subsequent first side.

To more readily understand and put into practical effect the present disclosure, particular aspects will now be described by way of examples and not limitations, and with reference to the drawings. For the sake of brevity, duplicate descriptions of features and properties may be omitted.

FIG. 1A shows a cross-sectional view of a printed circuit board assembly (also termed as electronic assembly) 100 according to an aspect of the present disclosure. In this illustration, it is shown the printed circuit board assembly 100, e.g., a multichip module assembly, for improved electrical performance and device miniaturization. The cross-section is taken along the A'-A line of FIG. 1B.

The term "multichip module" generally refers to a printed circuit board assembly that may include two or more silicon chips or devices that may be arranged laterally along the same plane. As different types of devices cater to different types of applications, more silicon chips or devices may be required in some systems to meet the requirements of high performance applications.

In FIG. 1A, the printed circuit board assembly 100 may include a first printed circuit board (PCB) 102 and a second printed circuit board (PCB) 104. The first PCB 102 may include a first footprint 106. The second PCB 104 may include a second footprint 108. The first PCB 102 and the second PCB 104 may be asymmetrical. By "asymmetrical" in the present context means the first PCB 102 and the second PCB 104 may have footprints of different sizes. In one aspect of the present disclosure, the first footprint 106 of the first PCB 102 may be bigger than the second footprint 108 of the second PCB 104.

The first PCB 102 may have a first side 110 and an opposing second side 112. The second PCB 104 may have a subsequent first side 114 and an opposing subsequent second side 116. The asymmetrical first PCB 102 and the second PCB 104 may be laminated (or coupled) to each other by an adhesive layer 118. In one aspect of the present disclosure, the first PCB 102 may be laminated to the adhesive layer 118 at the first side 110 and the second PCB 104 may be laminated to the adhesive layer 118 at the subsequent first side 114. The adhesive layer 118 may include a prepreg lamination layer or a polyimide layer.

The first PCB 102 may be laminated on top of the second PCB 104. Due to the bigger first footprint 106 of the first PCB 102, one or more recessed portions or cavities (120a, 120b) may be formed at a perimeter of the first footprint 106 after lamination. In the aspect shown in FIG. 1A, two recessed portions (120a, 120b) may be formed.

The first PCB 102 may include a plurality of first vertical vias (122a, 122b, 122c, 122d) extending between the first side 110 and the opposing second side 112. The first PCB 102 may further include a plurality of metal traces (124a, 124b), (124c, 124d, 124e) arranged at the first side 110 and the second side 112, respectively. The first PCB 102 may additionally include a plurality of contact pads (126a, 126b), (126c, 126d, 126e, 126f) arranged at the first side 110 and the second side 112, respectively. The first vertical vias (122a, 122b, 122c, 122d) may be coupled to the plurality of metal traces (124a, 124b) arranged at the first side 110 and may be further coupled to the plurality of contact pads (126c, 126d) arranged at the second side 112. Alternatively or additionally, the first vertical via (122a, 122b, 122c, 122d) may be coupled to the plurality of contact pads (126a, 126b) arranged at the first side 110 and may be further coupled to the plurality of metal traces (124c, 124d, 124e) arranged at the second side 112.

In one aspect of the present disclosure, one or more first devices (128a, 128b), e.g., a DRAM device, a radio frequency integrated circuit (RFIC) communication device and/or a connector receptacle, may be disposed within the one or more recessed portions (120a, 120b) on the first side 110 of the first PCB 102. In a further aspect, one or more second devices 130, e.g., a central processing unit (CPU), a graphic processing unit (GPU), a system-on-chip (SOC), a field programmable gate array (FPGA), a platform controller hub (PCH chipset) and/or any combinations thereof, may be disposed or arranged on the second side 112 of the first PCB 102. The second device 130 on the second side 112 of the first PCB 102 may be coupled to the one or more first devices (128a, 128b) on the first side 110 through the plurality of first vertical vias (122a, 122b, 122c, 122d), metal traces (124a, 124b, 124c, 124d, 124e) and contact pads (126a, 126b, 126c, 126d). Direct communication between the first device (128a, 128b) and the second device 130 through the plurality of first vertical vias (122a, 122b, 122c, 122d) may improve the signal integrity through the reduction and/or avoidance of undesired electrical stub compared to a conventional Type-3 PCB design.

In one aspect of the present disclosure, the second PCB 104 may include one or more second vertical vias 132 extending between the subsequent first side 114 and the opposing subsequent second side 116. The second PCB 104 may further include a plurality of metal traces (134a), (134b) arranged at the subsequent first side 114 and the subsequent second side 116, respectively. The second vertical via 132 may be coupled to the metal trace 134a arranged at the subsequent first side 114 and may be further coupled to the contact pads (135a, 135b) arranged at the subsequent second side 116.

The printed circuit board assembly 100 may include one or more third vertical vias (136a, 136b) extending through the first side 110 of the first PCB 102 and the subsequent first side 114 of the second PCB 104. In the aspect shown in FIG. 1A, the third vias (136a, 136b) may extend from the second side 112 of the first PCB 102 to the subsequent second side 116 of the second PCB 104. The third vertical vias (136a, 136b) may be coupled to the contact pads (126e, 126f) arranged on the second side 112 of the first PCB 102 and may be further coupled to the metal traces (134a), (134b) arranged on the subsequent first side 114 and the subsequent second side 116 of the second PCB 104, respectively.

In one aspect of the present disclosure, one or more third devices (131a, 131b), e.g., a DRAM device, a power management integrated circuit (PMIC) device, a radio frequency integrated circuit (RFIC) communication device and/or a connector receptacle, may be coupled to the subsequent second side 116 of the second PCB 104. The third device 131a on the subsequent second side 116 of the second PCB 104 may be coupled to the one or more second devices 130 on the second side 112 of the first PCB 102 through the contact pads (135a, 135b), second vertical vias 132, metal traces 134a, third vertical vias 136a, and contact pads 126f. In a further aspect, the third device 131b on the subsequent second side 116 of the second PCB 104 may be coupled to the one or more second devices 130 on the second side 112 of the first PCB 102 through the contact pads 135c, metal traces 134b, third vertical vias 136b, and contact pads 126e. Direct communication between the third devices (131a, 131b) and the second device 130 through the plurality of second vertical vias 132 and/or the plurality of third vertical vias (136a, 136b) may improve the signal integrity through the reduction and/or avoidance of undesired electrical stub compared to a conventional Type-3 PCB design.

In one aspect of the present disclosure, one or more passive components 138 may be mounted on the second side 112 adjacent to the first device 128b and the second device 130 to achieve a shorter AC loop inductance for improved system power delivery. For example, the one or more passive components 138 may be directly coupled to the first device 128b through the first vertical vias 122d. Alternatively, the one or more passive components 138 may be further coupled to both the first device 128b and the second device 130 through the first vertical vias 122d, metal traces (124d, 124e) and contact pads 126b within the first PCB 102. In one aspect, the one or more passive components 138 may include a capacitor such as a multi-layer ceramic capacitor (MLCC) or a silicon capacitor. In another aspect, the one or more passive components 138 may include a resistor, an inductor, or a voltage regulator.

In the aspect shown in FIG. 1A, both the first PCB 102 and the second PCB 104 may be a Type-3 PCB with plated-through-hole vertical interconnects. In one aspect, the first PCB 102 may include a first dielectric material with a first dielectric loss tangent ranging from 0.002 to 0.012 to facilitate a low loss high-speed signal transmission. In one aspect, the second PCB 104 may include a second dielectric material with a second dielectric loss tangent greater than the first dielectric loss tangent. In one aspect, the second dielectric loss tangent may range from 0.012 to 0.023. In one aspect, each of the first and second dielectric material may be an epoxy polymer resin, an epoxy resin reinforced with fibre glass cloth, a polyimide, a polyester and/or a silicone layer.

The printed circuit board assembly 100 may have solder balls, electrical interconnects and routings, and other features, which may or may not be shown in any of the present figures and which are conventional features known to a person skilled in the art. Various couplings of the components may use conventional methods, including solder bonding, thermal compression bonding, or other metal diffusion method.

Figure 1B:
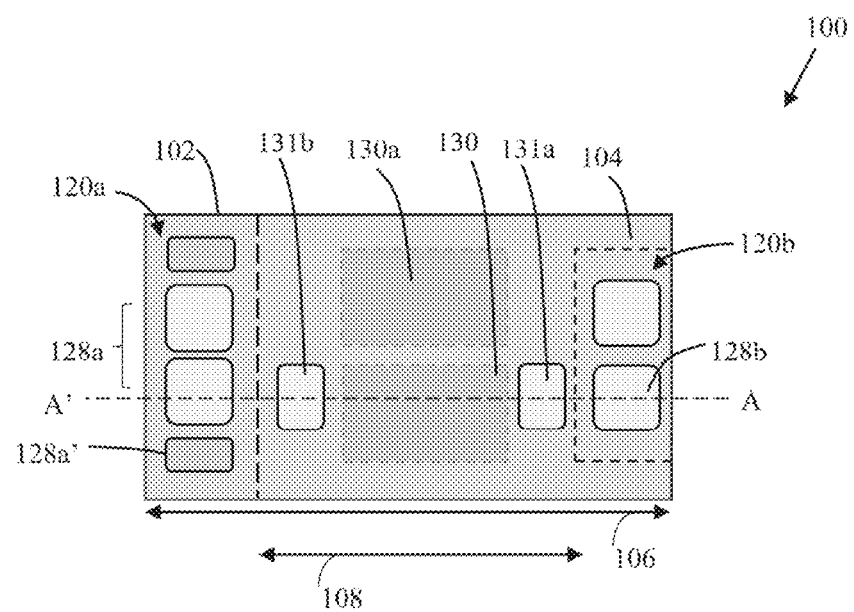
FIG. 1B shows a bottom view layout of the printed circuit board assembly according to the aspect as shown in FIG. 1A.

FIG. 1B shows a bottom view layout of the printed circuit board assembly 100 according to the aspect as shown in FIG. 1A.

As shown in FIG. 1B, the second device 130 and an adjacent subsequent second device 130a may fall within the first footprint 106 and the second footprint 108. The subsequent second device 130a may be identical to the second device 130, or different. In one aspect, the subsequent second device 130 may be a central processing unit (CPU), a graphic processing unit (GPU), a system-on-chip (SOC), a field programmable gate array (FPGA), a platform controller hub (PCH chipset), a neural network accelerator and/or any combinations thereof.

In the aspect shown in FIG. 1B, the printed circuit board assembly 100 may include an array of first devices (128a, 128a') arranged on a linear recessed portion 120a at one of the peripheries of the first footprint 106 (left section). In one aspect, the printed circuit board assembly 100 may further include a non-linear recessed portion 120b (right section) to accommodate mechanical design requirement.

Figure 2:
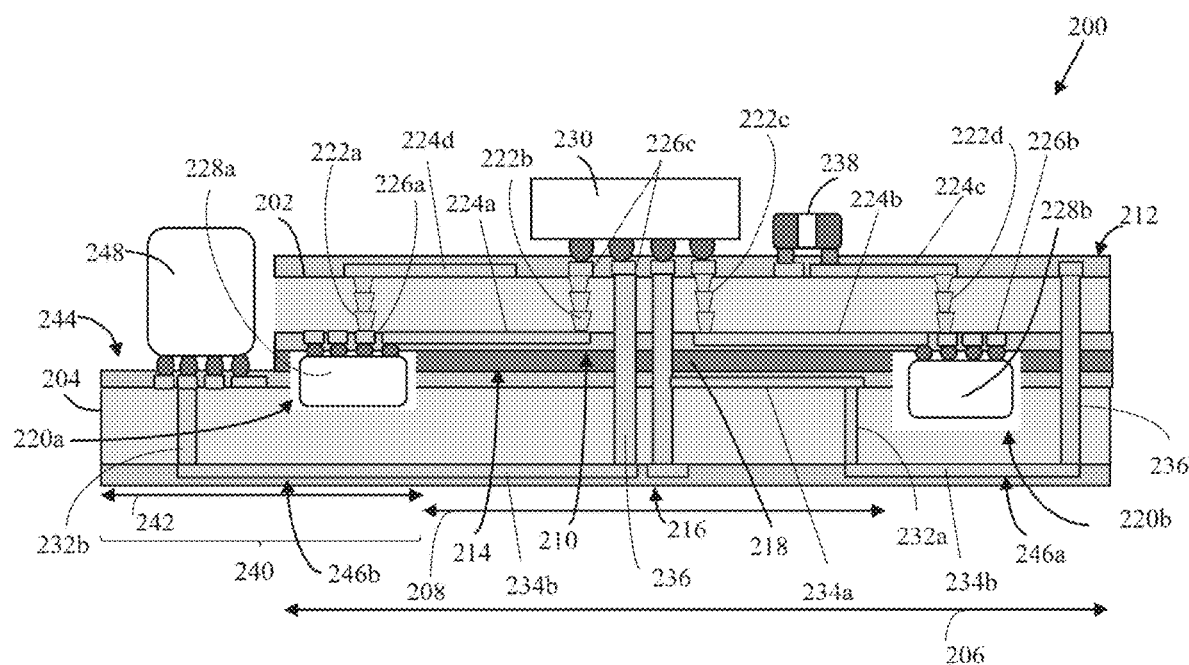
FIG. 2 shows a cross-sectional view of a printed circuit board assembly according to another aspect of the present disclosure.

FIG. 2 shows a cross-sectional view of a printed circuit board assembly 200 according to an aspect of the present disclosure. In this illustration, it is shown the printed circuit board assembly 200, e.g., a multichip module assembly, with two different types of printed circuit boards for tighter interconnects density. The printed circuit board assembly 200 may be similar to the printed circuit board assembly 100 of FIG. 1A and may include additional variations and components as described below.

In FIG. 2, the printed circuit board assembly 200 may include a first printed circuit board (PCB) 202 and a second printed circuit board (PCB) 204. The first PCB 202 may include a first footprint 206. The second PCB 204 may include a second footprint 208. The first PCB 202 and the second PCB 204 may be asymmetrical. By "asymmetrical" in the present context means the first PCB 202 and the second PCB 204 may have footprints of different sizes. In one aspect of the present disclosure, the first footprint 206 of the first PCB 202 may be bigger than the second footprint 208 of the second PCB 204.

The first PCB 202 may have a first side 210 and an opposing second side 212. The second PCB 204 may have a subsequent first side 214 and an opposing subsequent second side 216. The asymmetrical first PCB 202 and the second PCB 204 may be laminated (or coupled) to each other by an adhesive layer 218. In one aspect of the present disclosure, the first PCB 202 may be laminated to the adhesive layer 218 at the first side 210 and the second PCB 204 may be laminated to the adhesive layer 218 at the subsequent first side 214. The adhesive layer 218 may include a prepreg lamination layer or a polyimide layer.

The first PCB 202 may be laminated on top of the second PCB 204. Due to the bigger first footprint 206 of the first PCB 202, one or more recessed portions or cavities (220a, 220b) may be formed at a perimeter of the first footprint 206 after lamination. In the aspect shown in FIG. 2, two recessed portions (220a, 220b) may be formed.

The first PCB 202 may include a plurality of first vertical microvias (222a, 222b, 222c, 222d) extending between the first side 210 and the opposing second side 212. The first PCB 202 may further include a plurality of metal traces (224a, 224b), (224c) arranged at the first side 210 and the second side 212, respectively. The first PCB 202 may additionally include a plurality of contact pads (226a, 226b), (226c) arranged at the first side 210 and the second side 212, respectively. The first vertical microvias (222a, 222b, 222c, 222d) may be coupled to the plurality of metal traces (224a, 224b) arranged at the first side 210 and may be further coupled to the plurality of contact pads (226c) arranged at the second side 212. Alternatively or additionally, the first vertical microvias (222a, 222b, 222c, 222d) may be coupled to the plurality of contact pads (226a, 226b) arranged at the first side 210 and may be further coupled to the plurality of metal traces (224c, 224d) arranged at the second side 212.

In one aspect of the present disclosure, one or more first devices (228a, 228b), e.g., a DRAM device, a radio frequency integrated circuit (RFIC) communication device and/or a connector receptacle, may be disposed within the one or more recessed portions (220a, 220b) on the first side 210 of the first PCB 202. In a further aspect, one or more second devices 230, e.g., a central processing unit (CPU), a graphic processing unit (GPU), a system-on-chip (SOC), a field programmable gate array (FPGA), a platform controller hub (PCH chipset), a neural network accelerator and/or any combinations thereof, may be disposed or arranged on the second side 212 of the first PCB 202. The second device 230 on the second side 212 of the first PCB 202 may be coupled to the one or more first devices (228a, 228b) on the first side 210 through the plurality of first vertical microvias (222a, 222b, 222c, 222d), metal traces (224a, 224b, 224c, 224d) and contact pads (226a, 226b, 226c). Direct communication between the first device (228a, 228b) and the second device 230 through the plurality of first vertical microvias (222a, 222b, 222c, 222d) may improve the interconnect density and the signal integrity through shorter signal propagation delay and/or avoidance of undesired impedance discontinuities compared to conventional Type-3 and/or Type-4 PCB designs.

In one aspect of the present disclosure, the second PCB 204 may include one or more second vertical vias (232a, 232b) extending between the subsequent first side 214 and the opposing subsequent second side 216. The second PCB 204 may further include a plurality of metal traces (234a), (234b) arranged at the subsequent first side 214 and the subsequent second side 216, respectively. The second vertical via 232a may be coupled to the metal trace 234a arranged at the subsequent first side 214 and may be further coupled to the metal trace 234b arranged at the subsequent second side 216.

The printed circuit board assembly 200 may include one or more third vertical vias 236 extending through the first side 210 of the first PCB 202 and the subsequent first side 214 of the second PCB 204. In the aspect shown in FIG. 2, the third vias 236 may extend from the second side 212 of the first PCB 202 to the subsequent second side 216 of the second PCB 204. The third vertical vias 236 may be coupled to the contact pads 226c arranged on the second side 212 of the first PCB 202 and may be further coupled to the metal traces (234b), (234a) arranged on the subsequent second side 216 and the subsequent first side 214 of the second PCB 204, respectively.

In one aspect of the present disclosure, one or more passive components 238 may be mounted on the second side 212 adjacent to the first device 228b and the second device 230 to achieve a shorter AC loop inductance for improved system power delivery. For example, the one or more passive components 238 may be directly coupled to the first device 228b through the first vertical microvia 222d. Alternatively, the one or more passive components 238 may be further coupled to both the first device 228b and the second device 230 through the first vertical microvia 222d, metal traces 224c and contact pads (226b, 226c) within the first PCB 202. In one aspect, the one or more passive components 238 may include a capacitor such as a multi-layer ceramic capacitor (MLCC) or a silicon capacitor. In another aspect, the one or more passive components 238 may include a resistor, an inductor, or a voltage regulator.

In the aspect shown in FIG. 2, the first PCB 202 may be a Type 4 PCB without plated-through-hole vertical interconnects while the second PCB 204 may be a Type-3 PCB with plated-through-hole vertical interconnects. In one aspect, the first PCB 202 may include a first dielectric material with a first dielectric loss tangent ranging from 0.002 to 0.012 to facilitate a low loss high-speed signal transmission. In one aspect, the second PCB 204 may include a second dielectric material with a second dielectric loss tangent greater than the first dielectric loss tangent. In one aspect, the second dielectric loss tangent may range from 0.012 to 0.023. In one aspect, each of the first and second dielectric material may be an epoxy polymer resin, an epoxy resin reinforced with fibre glass cloth, a polyimide, a polyester and/or a silicone layer.

FIG. 2 illustrates an additional aspect of the present disclosure. The second PCB 204 may further include an extended portion 240 having a third footprint 242 extending beyond the perimeter of the first footprint 206. In one aspect, the extended portion 240 may include the recessed portion 220a configured to accommodate the first device 228a. The second PCB 204 may further include a plurality of metal shields (246a, 246b) extending over the one or more recessed portions (220a, 220b) and the first devices (228a, 228b) to provide shielding, e.g., electromagnetic and/or radiofrequency interference (EMI/RFI) shielding for the first devices (228a, 228b). In an aspect, the metal shields (246a, 246b) may include the plurality of third vertical vias 236, metal traces (234a, 234b) and the plurality of second vertical vias (232a, 232b). In an aspect, the metal shields (246a, 246b) may be associated with a reference voltage, e.g., a ground reference voltage (Vss) (not shown).

In one aspect shown in FIG. 2, a first extended device 248 may be coupled to the extended portion 240 on the subsequent first side 214 within a subsequent recessed portion 244. In one aspect, the first extended device 248 may include a solid-state drive (SSD) or a computer extension card, e.g., an M.2 card. One advantage of providing the subsequent recessed portion 244 is relatively tall components or devices may be mounted here. Additionally, shorter signal interconnects between the first extended device 248 and the second device 230 through the plurality of second vertical vias 232*b* may improve the signal integrity through reduced propagation delay and/or avoidance of undesired impedance discontinuities compared to conventional PCB designs.

The printed circuit board assembly 200 may have solder balls, electrical interconnects and routings, and other features, which may or may not be shown in any of the present figures and which are conventional features known to a person skilled in the art. Various couplings of the components may use conventional methods, including solder bonding, thermal compression bonding, or other metal diffusion method.

FIGS. 3A through 3G show cross-sectional views directed to an exemplary simplified process flow for forming a printed circuit board assembly 300, according to an aspect that is generally similar to that shown in FIG. 1A of the present disclosure. The order of assembly process operation may be interchangeable.

Figure 3A:
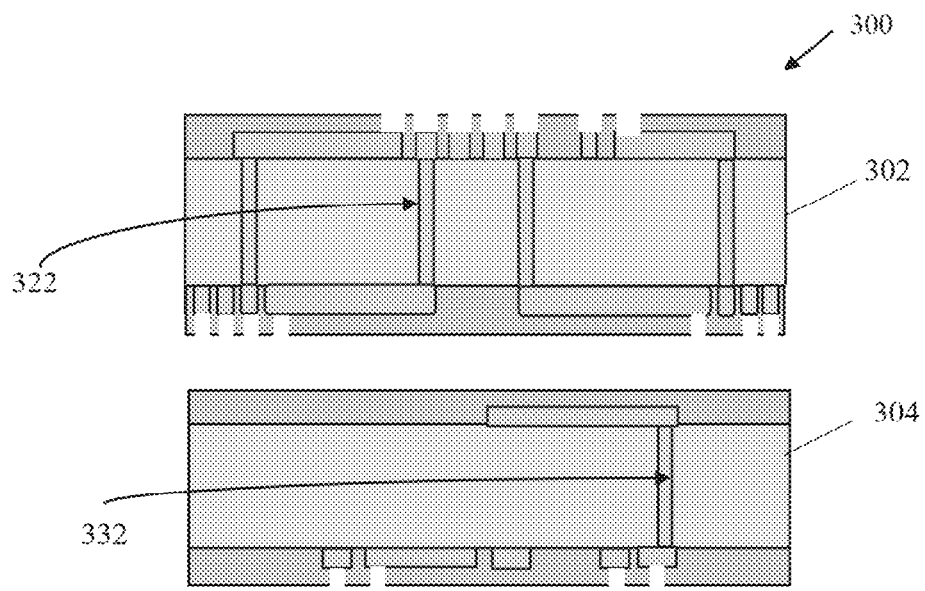
FIGS. 3A through 3G show cross-sectional views directed to an exemplary simplified process flow for forming a printed circuit board assembly according to an aspect that is generally similar to that shown in FIG. 1A of the present disclosure.

FIG. 3A shows a first printed circuit board (PCB) 302 and a second PCB 304. The first PCB 302 may already include a plurality of vertical vias or interconnects 322 embedded therein. The second PCB 304 may already include a plurality of vertical vias or interconnects 332 embedded therein. A plurality of metal traces and/or contact pads may be disposed on both sides of the first PCB 302 and the second PCB 304. Conventional techniques may be employed, such as but not limited to, lamination, mechanical drilling, etching, and electroplating process.

Figure 3B:
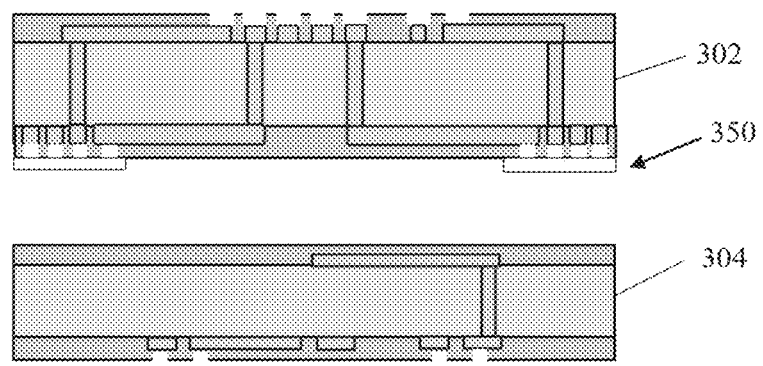

FIG. 3B shows formation of a relief sheet 350 arranged on a first side of the first PCB 302. The relief sheet 350 may later facilitate the positioning of recessed portions for accommodating devices. The relief sheet 350 may be laminated onto the first PCB 302.

Figure 3C:
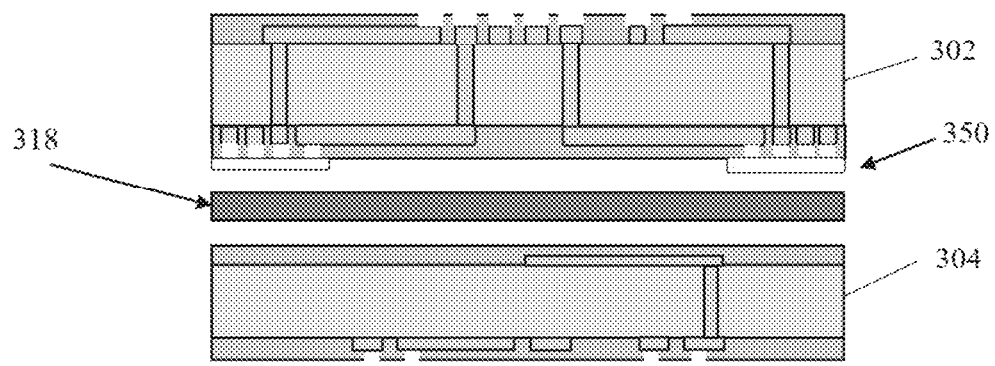
Figure 3D:
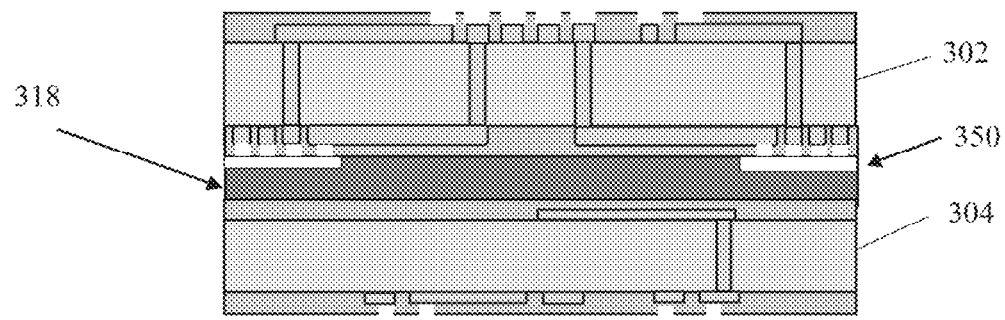

In FIG. 3C, an adhesive layer 318 may be arranged between the first PCB 302 and the second PCB 304. A lamination process, e.g., by hot-pressing, may then take place to form a laminated first PCB 302 and second PCB 304 as shown in FIG. 3D.

Figure 3E:
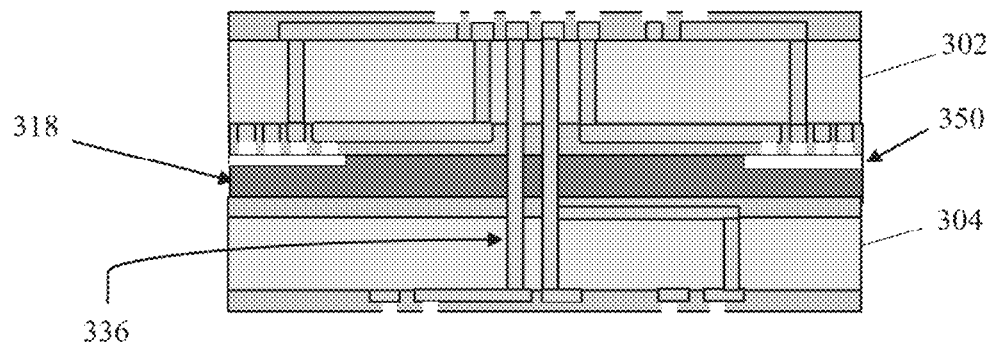

In FIG. 3E, a plurality of third vertical vias 336 may be provided in the laminated first PCB 302 and second PCB 304. The plurality of third vertical vias 336 may run through the entire thickness of the first PCB 302, the adhesive layer 318, and the second PCB 304. Conventional techniques for forming the plurality of third vias 336 may be employed, such as but not limited to, mechanical drilling, electroplating and etching process.

Figure 3F:
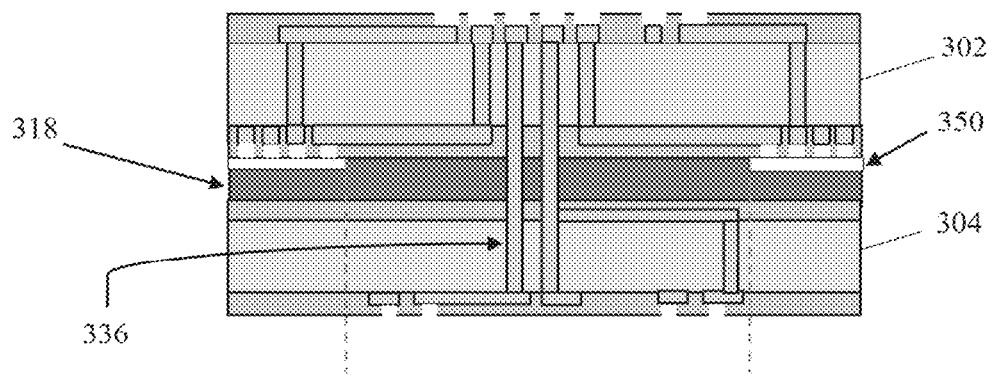

FIG. 3F shows a partial removal of the second PCB 304 along the dashed lines corresponding to the perimeter of the relief sheet 350. Portions of the second PCB 304 may be removed by conventional processes such as laser or mechanical sawing, etching, etc.

Figure 3G:
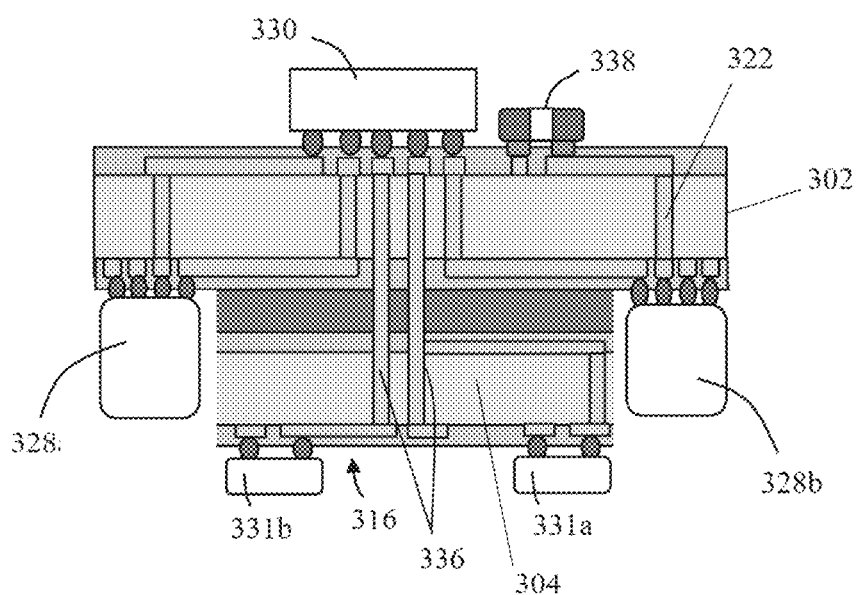

FIG. 3G shows attachment of various components onto the laminated first PCB 302 and second PCB 304. For example, first devices (328*a*, 328*b*) may be coupled to the first PCB 302 at locations where portions of the second PCB 304 were removed. A second device 330 and/or a passive component 338 may be arranged on the first PCB 302 at different locations, and may be coupled to the first devices (328*a*, 328*b*) through the plurality of vertical vias 322, metal traces and/or contact pads. A plurality of third devices (331*a*, 331*b*) may be arranged on a subsequent second side 316 of the second PCB 304, and may be coupled to the second device 330 through the plurality of third vertical vias 336, metal traces and/or contact pads. The various components may be attached by surface mounting, reflow or thermal compression bonding processes.

Figure 4:
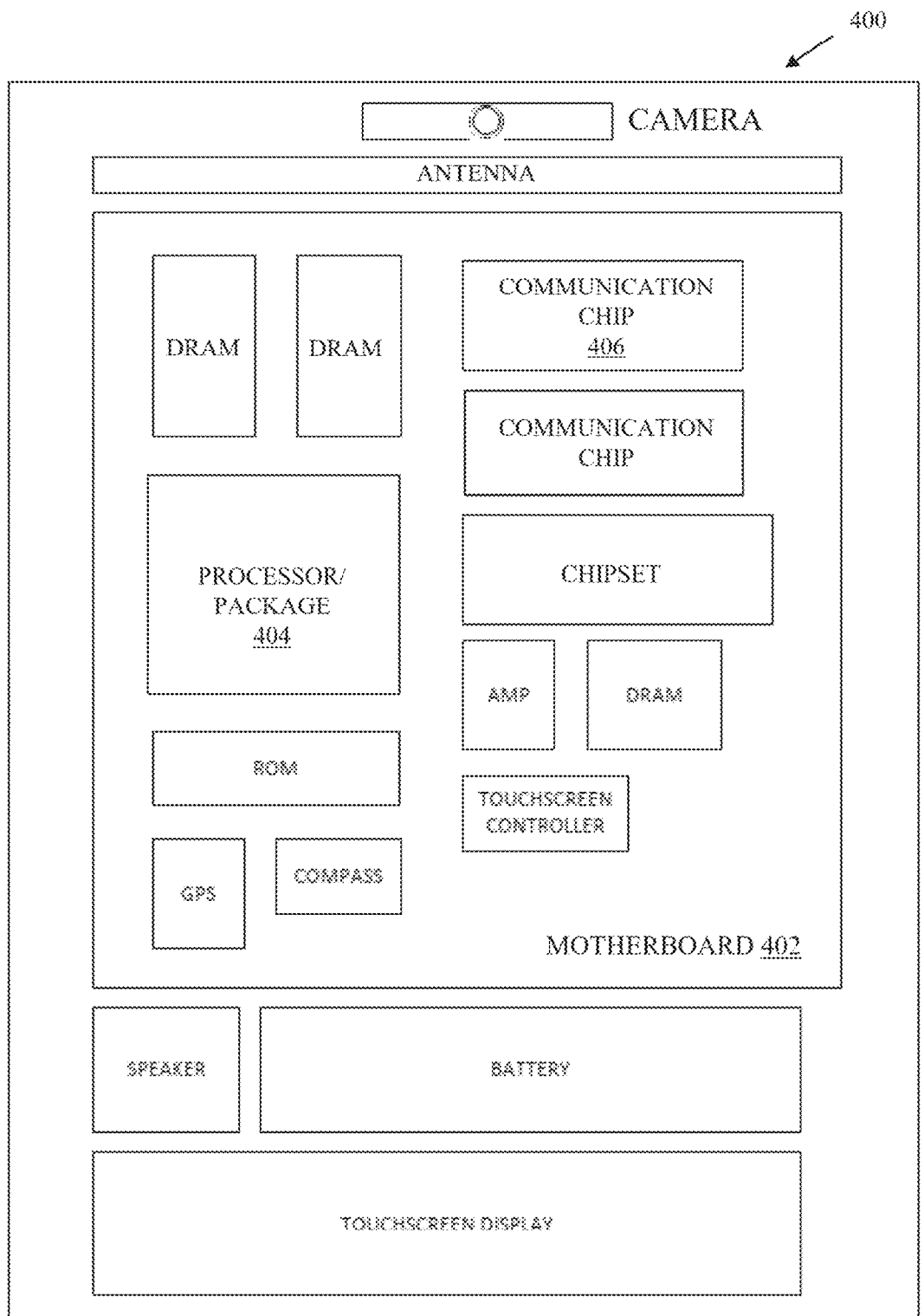
FIG. 4 shows an illustration of a computing device that includes a printed circuit board assembly according to a further aspect of the present disclosure.

Aspects of the present disclosure may be implemented into a system using any suitable hardware and/or software. FIG. 4 schematically illustrates a computing device 400 that may include a printed circuit board assembly as described herein, in accordance with some aspects. The computing device 400 may house a board such as a motherboard 402. The motherboard 402, which may be a printed circuit board assembly according to the present disclosure, may include a number of components, including but not limited to a processor 404 and at least one communication chip 406. The processor 404 may be physically and electrically coupled to the motherboard 402. In some implementations, the at least one communication chip 406 may also be physically and electrically coupled to the motherboard 402. In further implementations, the communication chip 406 may be part of the processor 404.

Depending on its applications, computing device 400 may include other components that may or may not be physically and electrically coupled to the motherboard 402. These other components may include, but are not limited to, volatile memory (e.g. DRAM), non-volatile memory (e.g. ROM), flash memory, a graphics processor, a digital signal processor, a cryptoprocessor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 406 may enable wireless communications for the transfer of data to and from the computing device 400. The term "wireless" and its derivatives may be used to describe circuits, devices, systems, methods, techniques, communications channels, etc. that may communicate data through the use of modulated electromagnetic radiation through a non-solid medium. The term does not imply that the associated devices do not contain any wires, although in some aspects they might not. The communication chip 406 may implement any of a number of wireless standards or protocols, including but not limited to Institute for Electrical and Electronic Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 406 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 406 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 406 may operate in accordance with other wireless protocols in other aspects.

The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

In various implementations, the computing device 400 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 400 may be a mobile computing device. In further implementations, the computing device 400 may be any other electronic device that processes data.

Figure 5:
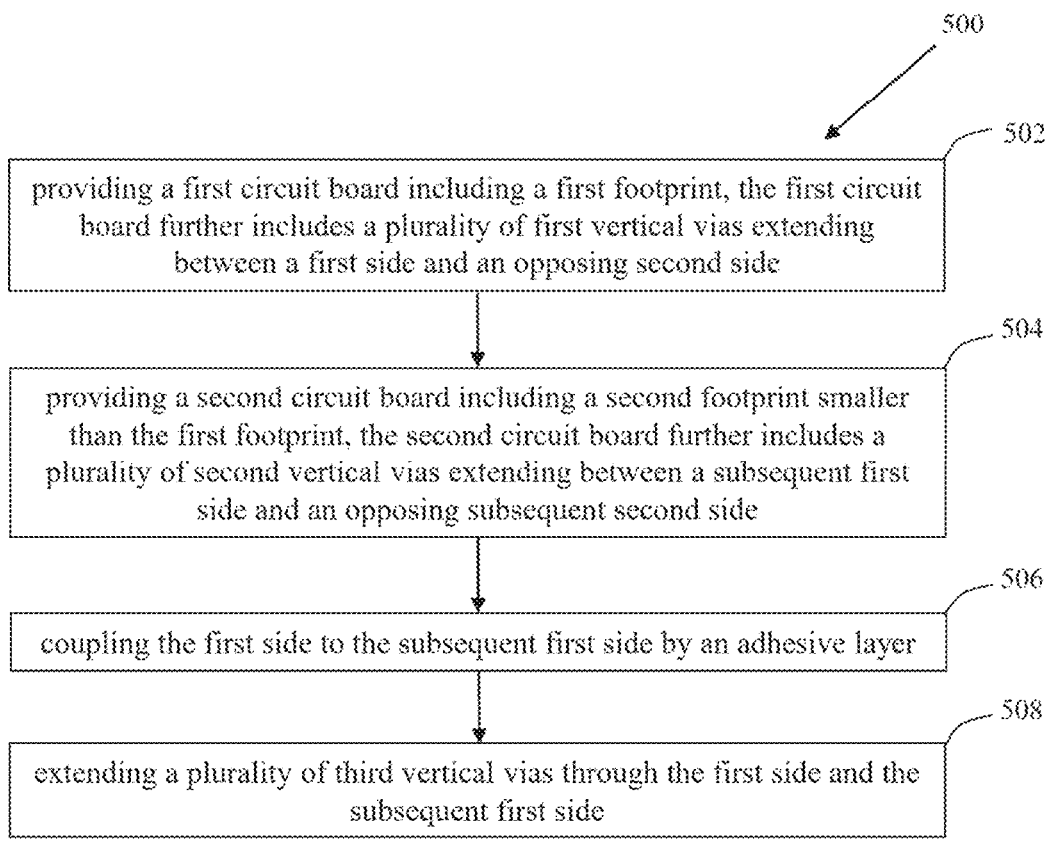
FIG. 5 shows a flow chart illustrating a method for forming a printed circuit board assembly according to an aspect of the present disclosure.

FIG. 5 shows a flow chart illustrating a method 500 of forming a printed circuit board assembly according to an aspect of the present disclosure.

At operation 502, the method 500 of forming the printed circuit board assembly may include providing a first circuit board including a first footprint. The first circuit board may further include a plurality of first vertical vias extending between a first side and an opposing second side At operation 504, the method 500 of forming the printed circuit board assembly may further include providing a second circuit board including a second footprint smaller than the first footprint. The second circuit board may further include a plurality of second vertical vias extending between a subsequent first side and an opposing subsequent second side.

At operation 506, the method 500 of forming the printed circuit board assembly may further include coupling the first side to the subsequent first side by an adhesive layer.

At operation 508, the method 500 of forming the printed circuit board assembly may further include extending a plurality of third vertical vias through the first side and the subsequent first side.

It will be understood that the above operations described above relating to FIG. 5 are not limited to this particular order. Any suitable, modified order of operations may be used.

EXAMPLES

Example 1 may include a printed circuit board assembly including a first circuit board including a first footprint, the first circuit board may further include a plurality of first vertical vias extending between a first side and an opposing second side; a second circuit board including a second footprint smaller than the first footprint, the second circuit board may further include a plurality of second vertical vias extending between a subsequent first side and an opposing subsequent second side; an adhesive layer coupling the first side to the subsequent first side; and a plurality of third vertical vias extending through the first side and the subsequent first side.

Example 2 may include the printed circuit board assembly of example 1 and/or any other example disclosed herein, wherein the second footprint may form one or more recessed portions at a perimeter of the first footprint.

Example 3 may include the printed circuit board assembly of example 2 and/or any other example disclosed herein, further including one or more first devices coupled to the first side within the one or more recessed portions.

Example 4 may include the printed circuit board assembly of example 1 and/or any other example disclosed herein, further including a second device coupled to the second side, wherein the second device may be coupled to the one or more first devices through the plurality of first vertical vias, a plurality of metal traces and a plurality of contact pads.

Example 5 may include the printed circuit board assembly of example 3 and/or any other example disclosed herein, wherein the one or more first devices may include a dynamic random-access memory (DRAM) device, a universal serial bus (USB) connector receptacle, a high definition media interface (EIDMI) connector receptacle, or an ethernet connector receptacle.

Example 6 may include the printed circuit board assembly of example 4 and/or any other example disclosed herein, wherein the second device may include a central processing unit (CPU), a graphic processing unit (GPU), a field programmable gate array (FPGA), a neural network accelerator, a platform controller hub or chipset device or any combinations thereof.

Example 7 may include the printed circuit board assembly of example 1 and/or any other example disclosed herein, further including one or more passive components disposed on the second side, wherein the one or more passive components may be coupled to the one or more first devices through the plurality of first vertical vias.

Example 8 may include the printed circuit board assembly of example 7 and/or any other example disclosed herein, wherein the one or more passive components may include a capacitor, a resistor, an inductor, or a voltage regulator.

Example 9 may include the printed circuit board assembly of example 1 and/or any other example disclosed herein, wherein the second circuit board may further include an extended portion having a third footprint extending beyond the perimeter of the first footprint.

Example 10 may include the printed circuit board assembly of example 9 and/or any other example disclosed herein, wherein the extended portion may further include one or more recesses configured to accommodate the one or more first devices.

Example 11 may include the printed circuit board assembly of example 10 and/or any other example disclosed herein, wherein the second circuit board may further include a metal shield extending over the one or more recesses and the one or more first devices.

Example 12 may include the printed circuit board assembly of example 9 and/or any other example disclosed herein, further including a first extended device coupled to the extended portion on the subsequent first side.

Example 13 may include the printed circuit board assembly of example 9 and/or any other example disclosed herein, wherein the first extended device may include a solid-state drive (SSD), a power management integrated circuit (PMIC), a voltage regulator, a connector receptacle or a computer extension card.

Example 14 may include the printed circuit board assembly of example 1 and/or any other example disclosed herein, wherein the first circuit board may further include a first dielectric material with a first dielectric loss tangent and the second circuit board may further include a second dielectric material with a second dielectric loss tangent greater than the first dielectric loss tangent.

Example 15 may include a computing device including a communication chip and a printed circuit board assembly coupled to the communication chip, the printed circuit board assembly may include a first circuit board including a first footprint, the first circuit board may further include a plurality of first vertical vias extending between a first side and an opposing second side; a second circuit board including a second footprint smaller than the first footprint, the second circuit board may further include a plurality of second vertical vias extending between a subsequent first side and an opposing subsequent second side; an adhesive layer coupling the first side to the subsequent first side; and a plurality of third vertical vias extending through the first side and the subsequent first side.

Example 16 may include the computing device of any one of examples 1 to 15 disclosed herein, wherein the second footprint may form one or more recessed portions at a perimeter of the first footprint.

Example 17 may include the computing device of any one of examples 1 to 16 disclosed herein, wherein the second circuit board may further include an extended portion having a third footprint extending beyond the perimeter of the first footprint.

Example 18 may include a method including providing a first circuit board including a first footprint, the first circuit board may further include a plurality of first vertical vias extending between a first side and an opposing second side; providing a second circuit board including a second footprint smaller than the first footprint, the second circuit board may further include a plurality of second vertical vias extending between a subsequent first side and an opposing subsequent second side; coupling the first side to the subsequent first side by an adhesive layer; and extending a plurality of third vertical vias through the first side and the subsequent first side.

Example 19 may include the method of example 18 and/or any other example disclosed herein, further forming one or more recessed portions at a perimeter of the first footprint.

Example 20 may include the method of example 18 and/or any other example disclosed herein, further forming an extended portion having a third footprint extending beyond the perimeter of the first footprint.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") used herein may be understood as electrically coupled or as mechanically coupled, e.g. attached or fixed or mounted, or just in contact without any fixation, and it will be understood that both direct coupling and indirect coupling (in other words, coupling without direct contact) may be provided.

While the present disclosure has been particularly shown and described with reference to specific aspects, it should be understood by persons skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A printed circuit board assembly comprising:
   a first circuit board including a first footprint, the first circuit board further includes a plurality of first vertical vias extending between a first side and an opposing second side;
   a second circuit board including a second footprint smaller than the first footprint, the second circuit board further includes a plurality of second vertical vias extending between a subsequent first side and an opposing subsequent second side, wherein the second footprint forms one or more recessed portions at a perimeter of the first footprint;
   an adhesive layer coupling the first side to the subsequent first side;
   a plurality of third vertical vias extending through the first side and the subsequent first side; and
   one or more first devices coupled to the first side and disposed within the one or more recessed portions.

2. The printed circuit board assembly of claim 1, further comprising a second device coupled to the second side, wherein the second device is coupled to the one or more first devices through the plurality of first vertical vias, a plurality of metal traces and a plurality of contact pads.

3. The printed circuit board assembly of claim 1, wherein the one or more first devices comprises a dynamic random-access memory (DRAM) device, a universal serial bus (USB) connector receptacle, a high definition media interface (HDMI) connector receptacle, or an ethernet connector receptacle.

4. The printed circuit board assembly of claim 2, wherein the second device comprises a central processing unit (CPU), a graphic processing unit (GPU), a field programmable gate array (FPGA), a neural network accelerator, a platform controller hub or chipset device or any combinations thereof.

5. The printed circuit board assembly of claim 1, further comprising one or more passive components disposed on the second side, wherein the one or more passive components is coupled to the one or more first devices through the plurality of first vertical vias.

6. The printed circuit board assembly of claim 5, wherein the one or more passive components comprises a capacitor, a resistor, an inductor, or a voltage regulator.

7. The printed circuit board assembly of claim 1, wherein the second circuit board further includes an extended portion having a third footprint extending beyond the perimeter of the first footprint.

8. The printed circuit board assembly of claim 7, wherein the extended portion further includes one or more recesses configured to accommodate the one or more first devices.

9. The printed circuit board assembly of claim 8, wherein the second circuit board further includes a metal shield extending over the one or more recesses and the one or more first devices.

10. The printed circuit board assembly of claim 7, further comprising a first extended device coupled to the extended portion on the subsequent first side.

11. The printed circuit board assembly of claim 10, wherein the first extended device comprises a solid-state drive (SSD), a power management integrated circuit (PMIC), a voltage regulator, a connector receptacle or a computer extension card.

12. The printed circuit board assembly of claim 1, wherein the first circuit board further comprises a first dielectric material with a first dielectric loss tangent and the second circuit board further comprises a second dielectric material with a second dielectric loss tangent greater than the first dielectric loss tangent.

13. A computing device comprising:
   a communication chip; and
   a printed circuit board assembly coupled to the communication chip, the printed circuit board assembly comprising:
      a first circuit board including a first footprint, the first circuit board further includes a plurality of first vertical vias extending between a first side and an opposing second side;
      a second circuit board including a second footprint smaller than the first footprint, the second circuit board further includes a plurality of second vertical vias extending between a subsequent first side and an opposing subsequent second side, wherein the second footprint forms one or more recessed portions at a perimeter of the first footprint;
      an adhesive layer coupling the first side to the subsequent first side;
      a plurality of third vertical vias extending through the first side and the subsequent first side; and
      one or more first devices coupled to the first side and disposed within the one or more recessed portions.

14. The computing device of claim 13, wherein the second circuit board further includes an extended portion having a third footprint extending beyond the perimeter of the first footprint.

15. A method comprising:
   providing a first circuit board including a first footprint, the first circuit board further includes a plurality of first vertical vias extending between a first side and an opposing second side;
   providing a second circuit board including a second footprint smaller than the first footprint, the second circuit board further includes a plurality of second vertical vias extending between a subsequent first side and an opposing subsequent second side;
   forming one or more recessed portions at a perimeter of the first footprint;
   coupling the first side to the subsequent first side by an adhesive layer;
   extending a plurality of third vertical vias through the first side and the subsequent first side; and
   coupling one or more first devices to the first side, wherein the one or more first devices are disposed within the one or more recessed portions.

16. The method of claim 15, further forming an extended portion having a third footprint extending beyond the perimeter of the first footprint.

* * * * *